Sept. 6, 1966 M. E. HINES ETAL 3,271,656

ELECTRIC WAVE FREQUENCY MULTIPLIER

Filed Oct. 1, 1962

INVENTORS
MARION E. HINES
FREDERICK P. COLLINS
BY Rosen & Schiller
ATTORNEYS

United States Patent Office 3,271,656

Patented Sept. 6, 1966

3,271,656

ELECTRIC WAVE FREQUENCY MULTIPLIER

Marion E. Hines, Weston, and Frederick P. Collins, Natick, Mass., assignors to Microwave Associates, Inc., Burlington, Mass., a corporation of Massachusetts Filed Oct. 1, 1962, Ser. No. 227,341

13 Claims. (Cl. 321—69)

This invention relates in general to electric wave frequency multiplier circuits, and more particularly to solid state generators of the third and higher-order harmonics of an input fundamental frequency.

It is the principal object of the present invention to provide a solid state frequency multiplier which in a single stage generates the third or a higher harmonic of a fundamental input frequency. An additional object is to provide a solid state frequency tripler or higher-order frequency multiplier having improved efficiency, and increased bandwidth with high efficiency. Another object of the invention is to provide such a solid state frequency multiplier which can be readily incorporated into multistage harmonic generators of substantial (i.e., 10 per cent or greater) bandwidth without introducing difficult tuning problems.

According to the invention in its more general aspect, there is provided an electric circuit for generating from the energy content of an electric wave having a given fundamental frequency a harmonic frequency wave greater than the second harmonic, comprising: a pair of non-linear impedance diode means connected in series opposition one to the other, means to apply an input electric wave having said fundamental frequency in push-pull balanced phase across said diode means in series, idler circuit means to derive an electric wave having a frequency which is the second harmonic of said fundamental frequency from said diode means in parallel with each other, and output means in circuit with said diode means to derive an output electric wave having a frequency which is a harmonic of said fundamental frequency higher than said second harmonic. For generating the third harmonic frequency of the input fundamental frequency, the output circuit means employs the diode means in series opposition with each other. For generating the fourth harmonic frequency of the input fundamental frequency a second idler circuit means is provided for the third harmonic having said diode means in series opposition with each other, and the output circuit means employs said idode means in parallel.

The foregoing and other objects and features of the invention will become apparent from the following description of certain exemplary embodiments. This description refers to the accompanying drawings, wherein.

Figures 1, 2, 3:
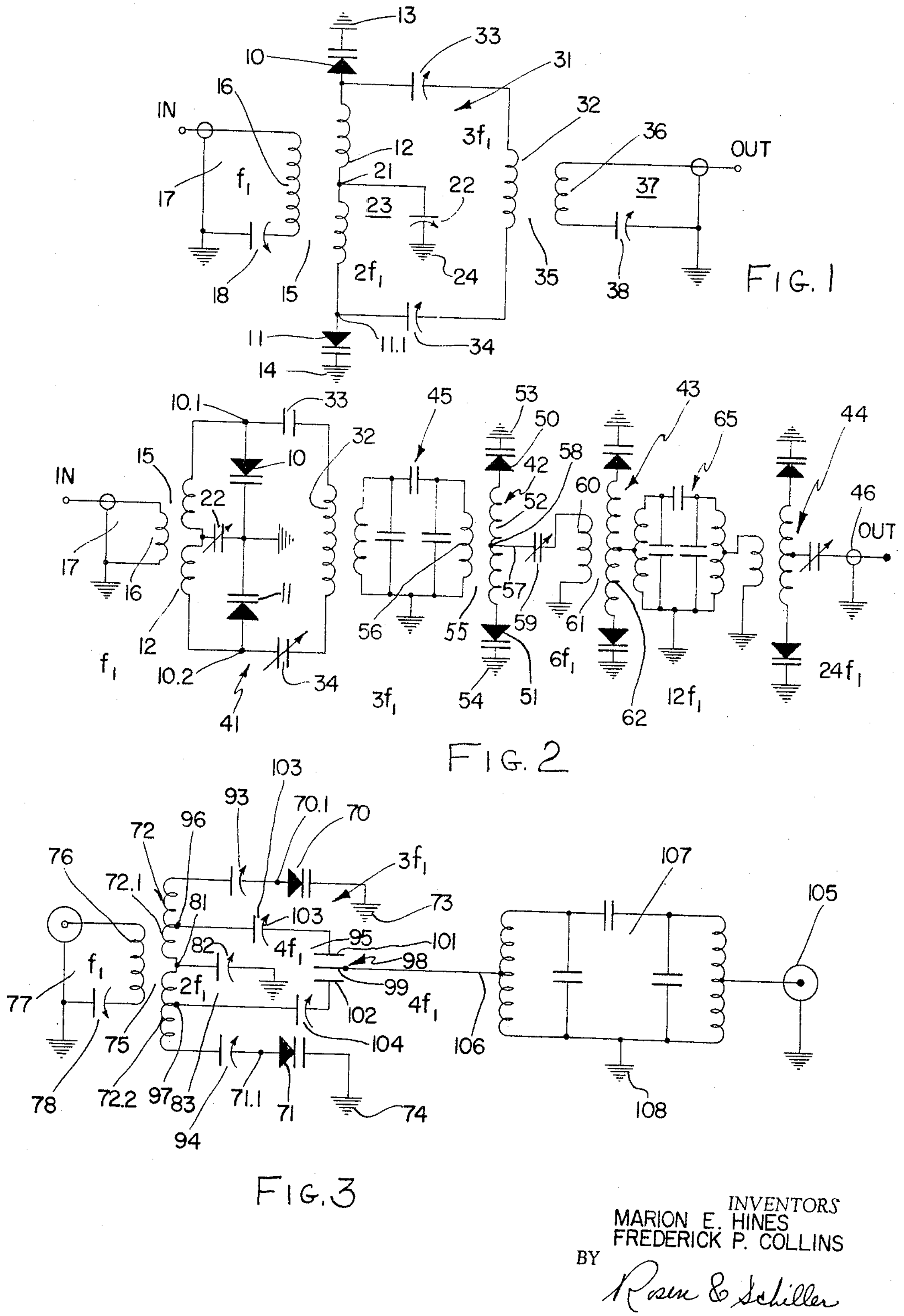
FIG. 1 is a circuit diagram illustrating the invention as applied to a single-stage frequency tripler.
FIG. 2 is a circuit diagram illustrating the invention as applied to a multi-stage harmonic generator.
FIG. 3 is a circuit diagram illustrating the invention as applied to a single-stage frequency quadrupler.

FIG. 1 illustrates a balanced frequency tripler circuit according to the invention. First and second non-linear impedence diode means 10 and 11 are connected in series opposition, with an intervening inductor 12 connected at junctions 10.1 and 11.1, respectively, between one pair of their like-polarity electrodes. Their remaining like-polarity electrodes are effectively connected together, via ground connections 13 and 14, respectively. The inductor 12 is in effect the secondary winding of an input transformer 15, the primary winding 16 of which is in the input circuit 17 for the fundamental frequency $f_1$. The input circuit includes a variable tuning capacitor 18. Optionally, the diode means 10 and 11 may be non-linear capacitance semiconductor diodes, or varactors, which may be used to maximize efficiency of the circuit.

An intermediate tap 21 on the inductor 12 is connected to ground 24 via a second variable tuning capacitor 22, to provided an idler circuit 23 for the second-harmonic frequency $2f_1$. The diodes 10 and 11 are in parallel with each other relative to the idler circuit 23, which is resonated with the second-harmonic by means of the tuning capacitor 22. If the tap 21 is centered, one-half of the inductor 12 is in series to ground 24 with one of the diodes 10, 11, respectively, in each parallel branch of the idler circuit, through the diode ground connections 13, 14, respectively.

The output circuit 31 in FIG. 1 is connected across the junctions 10.1 and 11.1 at the ends of the inductor 12, and includes, in series, an output inductor 32, and third and fourth variable tuning capacitors 33 and 34, respectively, by which the output circuit is resonated with the third harmonic frequency, $3f_1$. The output circuit, like the input circuit, is coupled to the varactors in balanced ($\pm$) phase, so that separate balanced resonant circuits 17 and 31 are used for the input and third harmonic frequencies, respectively. The second harmonic circuit 23 takes its energy from the varactors in parallel ($\ddagger$) phase. Because of the symmetry of the circuit of FIG. 1, even harmonics are substantially excluded from the input circuit 17 and the output circuit 31, and the fundamental and its odd harmonics are substantially excluded from the idler circuit 23. By tuning the parallel second harmonic circuit 23 to resonance at the second harmonic frequency $2f_1$, giving an idler circuit, high-order harmonic generation is enhanced, and third harmonic efficiency has been substantially improved. In the present invention, the idler circuit 23 can be tuned independently of the fundamental $f_1$ and the third harmonic, and the second harmonic is balanced out. There is thus afforded a two-mode circuit, employing one mode for the idler, and another mode for the fundamental and the third harmonic of the fundamental.

The third-harmonic output wave is taken from FIG. 1 through an output transformer 35 having the output inductor 32 as its primary winding and another inductor 36 as its secondary winding, which feeds an output line loop 37, having a line tuning capacitor 38.

FIG. 2 illustrates a tandem multiplier consisting of one frequency tripler 41 and three frequency doublers 42, 43 and 44, respectively. The frequency tripler is similar in all material respects to the tripler which is illustrated in FIG. 1, and like components bear like reference characters.

A filter 45 is provided between the frequency tripler 41 and the first frequency doubler stage 42. This filter is designed to reject the fundamental frequency, and prevents the transmission to the first doubler circuit 42 of power at the fundamental frequency $f_1$ at any magnitude sufficient to interfere with the operation of the doubler circuit.

The first frequency doubler 42 comprises second and third non-linear impedance diode means 50 and 51, respectively, which are connected in series opposition, with an inductor 52 between one pair of like-polarity electrodes. The remaining pair of like-polarity electrodes are essentially connected together via ground connections 53 and 54, respectively. The inductor 52 is the secondary winding of an input transformer 55, the primary winding 56 of which is an element of the filter 45. An alternating wave appearing as the input signal to the doubler 42 from the filter 45 will be applied in push-pull or balanced ($\pm$) phase to the diodes 50 and 51.

The output circuit of the first frequency doubler 42 comprises the two diodes 50 and 51 in parallel with a transmission line 57 connected at one end to a center tap 58 on the secondary winding 52. One-half of the secondary winding 52 (input impedance element of the first frequency doubler 42) is thus included in each parallel branch of the output circuit. The output is thus taken from the diodes 50 and 51 in parallel (‡) phase. Becase of the symmetry which inheres in this arrangement, the input frequency ($3f_1$) and its odd harmonics (3rd, 5th, etc.) are essentially excluded from the output circuit of the frequency doubler, and the even harmonics (2nd, 4th, 6th, etc.) of the input frequency ($3f_1$) are essentially excluded from the input circuit of the frequency doubler.

The output frequency, ($6f_1$), is applied via a variable coupling and tuning capacitor 59 to the primary winding 60 of an input transformer 61 to the second frequency doubler 43. The second doubler is in all essential respects similar to the first doubler 42. The secondary 62 of its input transformer constitutes its input impedance element. The output of the second frequency doubler, ($12f_1$), is applied to the third frequency doubler via a second band-pass filter 65. Obviously, a suitable band-pass filter (not shown) may be employed to couple the first and second doublers 42 and 43, in place of the coupling capacitor 59, if desired. The third frequency doubler 44 is essentially the same as the first and second frequency doublers 42 and 43, respectively.

It will be recognized that the idler circuit 23 in FIG. 1 is essentially similar to the output of the doubler circuits in FIG. 2, and affords the same characteristic of isolation of the second harmonic of the input frequency from the input frequency as do the doubler circuits. This characteristic permits not only the ready isolation of second harmonic energy in the frequency tripler of FIG. 1, but also the use of doublers in tandem as shown in FIG. 2, and this feature is another advantage of the present invention.

The frequency multiplier arrangement shown in FIG. 2 will produce at the output 46 the 24th harmonic of an input frequency $f_1$. In one case an embodiment according to FIG. 2 was built which accepted input power in the 40–50 megacycles per second range and delivered power at the output at the 24th harmonic of the input fundamental frequency, at a level greater than one watt over a 7-percent bandwidth. Other circuits according to FIG. 2 have repeatedly yielded 1.4 watts of output over the band of frequencies 960–1025 megacycles per second. Thus multipliers according to FIG. 2 can readily accept an input power of 10 watts at 40 megacycles per second and produce 1.4 watts at 960 megacycles per second at the output, with an overall 3 db bandwidth which is approximately 10 percent for the four stages.

The last frequency doubler 44, which doubles in these embodiments from 480 to 960 megacycles per second, uses "lumped" inductors and capacitors. Use of this technique at these frequencies is well beyond the range where such methods have heretofore been considered applicable. These results have been achieved by using coils of very small size with short lead lengths.

The individual stages shown in FIG. 2 are each much broader-band than the final output. Some individual stage characteristics are:

| | Bandwidth | Power Output |
|---|---|---|
| 1. Tripler 41 | 20% | 6 watts. |
| 2. First Doubler 42 | 30% (approx.) | 4 watts. |
| 3. Second Doubler 43 | 30% (approx.) | 2.8 watts. |
| 4. Third Doubler 44 | 30% (approx.) | 4 watts. |

In FIG. 3, a frequency quadrupler comprises first and second non-linear impedance diode means 70 and 71 connected in series opposition, with an intervening inductor 72 connected at junctions 70.1 and 71.1, respectively, between one pair of their like-polarity electrodes.

Their remaining like-polarity electrodes are effectively connected together via ground connections 73 and 74, respectively. The inductor 72 is effectively in two series-connected parts 72.1 and 72.2 joined at a common junction 81, and constitutes the secondary winding of an input transformer 75, the primary winding 76 of which is in the input circuit 77 for the fundamental frequency $f_1$. The input circuit includes a variable tuning capacitor 78. As in FIG. 1, the diode means 70 and 71 may optionally be non-linear capacitance semiconductor diodes, or varactors.

The intermediate tap or common junction 81 of the inductor 72 is connected to ground 84 via a second variable tuning capacitor 82, to provide an idler circuit 83 for the second-harmonic frequency $2f_1$. As in FIG. 1, the diodes 70 and 71 are in parallel (‡) phase with each other relative to the idler circuit 83, which is resonated with the second-harmonic by means of the tuning capacitor 82, and one-half of the inductor 12 is in series to ground 84 with one of the diodes 70, 71, respectively, in each parallel branch of the second-harmonic idler circuit, through the diode ground connections 73, 74, respectively.

A second idler circuit, for the third-harmonic frequency, is constituted by the loop including the entire inductor 72, the diodes 70 and 71 and their ground connectors 73 and 74, respectively. The diodes are connected in balanced (±) phase in this circuit, which is resonated to the third-harmonic frequency ($3f_1$) of the input fundamental frequency, with the aid of capacitor means 93, 94.

The output circuit comprises a symmetrical capacitor 98, represented in FIG. 3 as having intermediate plate means 99 and outer plate means 101 and 102, respectively, on opposite sides thereof. The outer plate means 101 and 102 are connected, respectively, via variable capacitors 103 and 104 to intermediate taps 96 and 97, respectively, on the two parts 72.1 and 72.2, respectively, of the inductor 72. The intermediate plate means 99 is connected to an output terminal 105 via an output line 106 and a bandpass filter 107 having a ground connection 108. The output circuit has two parallel branches; one branch may be traced from ground connection 73 through diode 70, tuning capacitor 93, the portion of inductor part 72.1 to intermediate tap 96, tuning capacitor 103 and outer plate means 101, to the intermediate plate means 99 of the symmetrical capacitor 98, and thence via line 106 to the filter 107 and ground 108; the second branch may be similarly traced from ground connection 74 through diode 71, tuning capacitor 94, the portion of inductor part 72.2 to intermediate tap 97, tuning capacitor 104 and outer plate means 102, to the intermediate plate means 99 of the symmetrical capacitor 98, and thence in common with the first branch. It will be apparent that the diodes 70 and 71 are in parallel (‡) phase in the output circuit.

Thus, the circuit of FIG. 3 is, like that of FIG. 1, a two mode frequency multiplier circuit in which one mode, parallel (‡) phase is reserved for even harmonics of the input frequency, and a second different mode, balanced (±) phase is reserved for the odd harmonics.

The embodiments of the invention which have been illustrated and described herein are but a few illustrations of the invention. Other embodiments and modifications will occur to those skilled in the art. No attempt has been made to illustrate all possible embodiments of the invention, but rather only to illustrate its principles and the best manner presently known to practice it. Therefore, while certain specific embodiments have been described as illustrative of the invention, such other forms as would occur to one skilled in this art on a reading of the foregoing specification are also within the spirit and scope of the invention, and it is intended that this invention includes all modifications and equivalents which fall within the scope of the appended claims.

What is claimed is:

1. Electric circuit for generating from the energy content of an electric wave having a given fundamental frequency a harmonic-frequency wave greater than the second-harmonic, comprising: a pair of non-linear impedance diode means connected in series opposition one to the other, means to apply an input electric wave having said fundamental frequency in push-pull balanced phase across said diode means in series, idler circuit means to derive an electric wave having a frequency which is the second-harmonic of said fundamental frequency from said diode means in parallel with each other, and output circuit means to derive from said diode means an output electric wave having a frequency which is a harmonic of said fundamental frequency greater than said second-harmonic.

2. Electric circuit for generating the third-harmonic frequency wave from the energy content of an electric wave having a given fundamental frequency comprising: a pair of non-linear impedance diode means connected in series opposition one to the other, means to apply an input electric wave having said fundamental frequency in push-pull balanced phase across said diode means in series, idler circuit means to derive an electric wave having a frequency which is the second-harmonic of said fundamental frequency from said diode means in parallel with each other, and output circuit means to derive an output electric wave having a frequency which is the third-harmonic of said fundamental frequency from said diode means in series opposition with each other.

3. Electric circuit for generating the fourth-harmonic frequency wave from the energy content of an electric wave having a given fundamental frequency comprising: a pair of non-linear impedance diode means connected in series opposition one to the other, means to apply an input electric wave having said fundamental frequency in push-pull balanced phase across said diode means in series, first idler circuit means to derive an electric wave having a frequency which is the second-harmonic of said fundamental frequency from said diode means in parallel with each other, second idler circuit means to derive an electric wave having a frequency which is the third-harmonic of said fundamental frequency from said diode means in series opposition with each other, and output circuit means to derive an output electric wave having a frequency which is the fourth-harmonic of said fundamental frequency from said diode means in parallel with each other.

4. Electric circuit for generating from the energy content of an electric wave having a given fundamental frequency a harmonic-frequency wave greater than the second-harmonic, comprising: first and second non-linear impedance diode means, impedance means interconnecting like-polarity electrodes of said diode means, an input circuit for said fundamental frequency wave, means coupling said input circuit to said impedance means for application of said fundamental frequency wave in push-pull to said diode means, an idler circuit having said diode means in parallel for circulation of electric waves at the second-harmonic frequency of said fundamental frequency, and an output circuit for deriving from said diode means an output electric wave at a frequency which is a harmonic of said fundamental frequency greater than said second-harmonic.

5. Electric circuit for generating the third-harmonic frequency wave from the energy content of an electric wave having a given fundamental frequency comprising: first and second non-linear impedance diode means, impedance means interconnecting like-polarity electrodes of said diode means, an input circuit for said fundamental frequency wave, means coupling said input circuit to said impedance means for application of said fundamental frequency wave in push-pull to said diode means, an idler circuit having said diode means in parallel for circulation of electric waves at the second-harmonic frequency of said fundamental frequency, and an output circuit having said diode means in series opposition for deriving an output electric wave at a frequency which is the third harmonic of said fundamental frequency.

6. Electric circuit for generating the fourth-harmonic frequency wave from the energy content of an electric wave having a given fundamental frequency comprising: first and second non-linear impedance diode means, impedance means interconnecting like-polarity electrodes of said diode means, an input circuit for said fundamental frequency wave, means coupling said input circuit to said impedance means for application of said fundamental frequency wave in push-pull to said diode means, a first idler circuit having said diode means in parallel for circulation of electric waves at the second-harmonic frequency of said fundamental frequency, a second idler circuit having said diode means in series opposition for circulation of electric waves at a frequency which is the third harmonic of said fundamental frequency, and an output circuit having said diode means in parallel for deriving an output electric wave at a frequency which is the fourth-harmonic of said fundamental frequency.

7. Electric circuit for generating from the energy content of an electric wave having a given fundamental frequency a harmonic-frequency wave greater than the second-harmonic comprising: first and second non-linear impedance diode means, impedance means interconnecting like-polarity electrodes of said diode means, an input circuit for said fundamental frequency wave, means coupling said input circuit to said impedance means for application of said fundamental frequency wave in push-pull to said diode means, an idler circuit having said diode means in parallel for circulating electric waves at the second-harmonic frequency of said fundamental frequency, and an output circuit coupled across at least a portion of said impedance means for deriving an output electric wave at a frequency which is a harmonic of said fundamental frequency greater than said second-harmonic.

8. Electric circuit for generating the third-harmonic frequency wave from the energy content of an electric wave having a given fundamental frequency comprising: first and second non-linear impedance diode means, impedance means interconnecting like-polarity electrodes of said diode means, an input circuit for said fundamental frequency wave, means coupling said input circuit to said impedance means for application of said fundamental frequency wave in push-pull to said diode means, an idler circuit having said diode means in parallel for circulating electric waves at the second-harmonic frequency of said fundamental frequency, and an output circuit coupled across said impedance means for deriving an output electric wave at a frequency which is the third-harmonic of said fundamental frequency.

9. Electric circuit for generating the fourth-harmonic frequency wave from the energy content of an electric wave having a given fundamental frequency comprising: first and second non-linear impedance diode means, impedance means interconnecting like-polarity electrodes of said diode means, an input circuit for said fundamental frequency wave, means coupling said input circuit to said impedance means for application of said fundamental frequency wave in push-pull to said diode means, a first idler circuit having said diode means in parallel for circulating electric waves at the second-harmonic frequency of said fundamental frequency, a second idler circuit having said diode means in series opposition for circulation of electric waves at a frequency which is the third-harmonic of said fundamental frequency, and an output circuit coupled across at least a portion of said impedance means for deriving an output electric wave at a frequency which is the fourth-harmonic of said fundamental frequency.

10. Electric circuit for generating the third-harmonic frequency wave from the energy content of an electric wave having a given fundamental frequency comprising: first and second non-linear impedance diode means connected in series opposition between two terminals, first and second impedance means connected in series between said two terminals and in parallel with said diode means, means to apply on input electric wave at said fundamental frequency across said two terminals, means coupled between the junction of said impedance means and the junction of said diode means providing an idler circuit for electric waves at the second-harmonic frequency of said fundamental frequency, and an output circuit coupled across said two terminals for deriving an output electric wave at a frequency which is the third harmonic of said fundamental frequency.

11. Electric circuit for generating the fourth-harmonic frequency wave from the energy content of an electric wave having a given fundamental frequency comprising: first and second non-linear impedance diode means connected in series opposition between two terminals, first and second impedance means connected in series between said two terminals and in parallel with said diode means, means to apply an input electric wave at said fundamental frequency across said two terminals, means coupled between the junction of said impedance means and the junction of said diode means providing an idler circuit for electric waves at the second-harmonic frequency of said fundamental frequency, and an output circuit coupled across portions of said impedance means including their junctions for deriving an output electric wave at a frequency which is the fourth-harmonic of said fundamental frequency.

12. Electric circuit for generating the sixth-harmonic frequency wave from the energy content of an electric wave having a given fundamental frequency comprising: first and second non-linear impedance diode means connected in series opposition between a first pair of terminals, first and second impedance means connected in series between said terminals and in parallel with said diode means, means to apply an input electric wave at said fundamental frequency across said terminals, means coupled between the junction of said impedance means and the junction of said diode means providing an idler circuit for electric waves at the second-harmonic frequency of said fundamental frequency, a second circuit coupled across said first pair of terminals for deriving an electric wave at a frequency which is the third-harmonic of said fundamental frequency, third and fourth non-linear impedance diode means connected in series opposition between a second pair of terminals, third and fourth impedance means connected in series between said second pair of terminals and in parallel with said third and fourth diode means, means including a filter tuned substantially to reject said fundamental frequency for applying an electric wave at said third-harmonic frequency across said second pair of terminals, and means coupled between the junction of said third and fourth impedance means and the junction of said third and fourth diode means for deriving an output electric wave which is the sixth-harmonic of said fundamental wave.

13. Electric circuit for generating an even-harmonic frequency wave from the energy content of an electric wave having a given fundamental frequency comprising: first and second non-linear impedance diode means connected in series opposition between a first pair of terminals, first and second impedance means connected in series between said terminals and in parallel with said diode means, means to apply an input electric wave at said fundamental frequency across said terminals, means coupled to the junction of said impedance means for providing an output circuit for electric waves at the second-harmonic frequency of said fundamental frequency, third and fourth non-linear impedance diode means connected in series opposition between a second pair of terminals, third and fourth impedance means connected in series between said second pair of terminals and in parallel with said third and fourth diode means, means including a filter tuned substantially to reject said fundamental frequency for applying an electric wave at said second-harmonic frequency across said second pair of terminals, and means coupled to the junction of said third and fourth impedance means for deriving an output electric wave which is the fourth-harmonic of said fundamental wave.

References Cited by the Examiner

UNITED STATES PATENTS

| | | | |
|---|---|---|---|
| 3,051,909 | 8/1962 | Engelbrecht | 330—4.9 |
| 3,084,335 | 4/1963 | Kosonocky et al. | 307—88.5 |
| 3,093,802 | 6/1963 | Chow | 307—88.5 |

OTHER REFERENCES

"Charge Storage Varactors Boost Harmonic Power," by Schaffner; Electronics, July 13, 1964, pp. 42–47.

"Parallel Varactor Diode Frequency Multiplier," by E. A. Jelesiewicz, RCA Technical Notes No. 650 (2 sheets), November 1965.

JOHN F. COUCH, *Primary Examiner.*

LLOYD McCOLLUM, *Examiner.*

G. J. BUDOCK, G. GOLDBERG, *Assistant Examiners.*